(12) United States Patent
Maiuzzo et al.

(10) Patent No.: US 9,998,083 B2
(45) Date of Patent: Jun. 12, 2018

(54) HIGH FREQUENCY TRANSMITTERS AND RECEIVERS

(71) Applicant: Liberty University, Lynchburg, VA (US)

(72) Inventors: Michael Anthony Maiuzzo, Forest, VA (US); Ronald T. Sones, Lynchburg, VA (US)

(73) Assignee: Liberty University, Lynchburg, VA (US)

( * ) Notice: Subject to any disclaimer, the term of this patent is extended or adjusted under 35 U.S.C. 154(b) by 34 days.

(21) Appl. No.: 14/627,818

(22) Filed: Feb. 20, 2015

(65) Prior Publication Data

US 2015/0188506 A1 Jul. 2, 2015

Related U.S. Application Data

(63) Continuation-in-part of application No. 13/155,979, filed on Jun. 8, 2011, now Pat. No. 8,965,307.

(60) Provisional application No. 61/429,709, filed on Jan. 4, 2011, provisional application No. 61/405,307, filed on Oct. 21, 2010, provisional application No. 61/352,566, filed on Jun. 8, 2010.

(51) Int. Cl.
| | |
|---|---|
| *H04B 1/18* | (2006.01) |
| *H03C 1/62* | (2006.01) |
| *H04B 1/04* | (2006.01) |
| *H03G 3/30* | (2006.01) |

(52) U.S. Cl.
CPC ............. *H03G 3/3042* (2013.01); *H04B 1/18* (2013.01)

(58) Field of Classification Search
CPC .. H01L 39/02; H04B 7/24; H04B 1/04; H04B 1/036; H03C 1/62
USPC ........... 455/114.2, 63.1, 67.13, 91, 103, 106, 455/107, 128, 501, 66.1, 550.1, 556.1, 455/575.1, 90.3, 115.1; 330/256, 265, 330/277; 62/114, 268, 269, 440, 600; 505/210, 201–202; 326/53, 54; 333/134, 333/202, 99 S, 208
See application file for complete search history.

(56) References Cited

U.S. PATENT DOCUMENTS

| | | | | |
|---|---|---|---|---|
| 5,200,709 | A * | 4/1993 | Saito ......................... | H03F 1/48 330/126 |
| 5,412,339 | A * | 5/1995 | Takano .................... | H03F 3/607 330/286 |
| 6,049,707 | A * | 4/2000 | Buer ..................... | H04B 1/0483 330/124 R |
| 6,104,934 | A * | 8/2000 | Patton et al. ................. | 455/561 |
| 6,211,732 | B1 * | 4/2001 | Maiuzzo et al. ............. | 330/126 |
| 6,698,224 | B2 * | 3/2004 | Kagaya et al. .............. | 62/259.2 |
| 6,778,042 | B2 * | 8/2004 | Terashima et al. ........... | 333/205 |
| 6,959,206 | B2 * | 10/2005 | Abdelmonem et al. ...... | 455/561 |
| 7,224,242 | B2 * | 5/2007 | Taylor ......................... | 333/99 S |

(Continued)

*Primary Examiner* — Pablo Tran
(74) *Attorney, Agent, or Firm* — Banner & Witcoff, Ltd.

(57) ABSTRACT

Transmission and reception of communications via high frequency antenna systems employing cooled pure copper or high-temperature superconductor filters and/or amplifiers are presented. A comb linear amplifier combiner and comb limiter combiner may be modified with, for example, cryogenically cooled pure copper and/or high-temperature superconductor components, such as matching units of bandpass filters. A computer control unit may be coupled to the transmission circuit and reception circuit to control operation of one or more filters, and/or amplifiers.

17 Claims, 8 Drawing Sheets

(56) References Cited

U.S. PATENT DOCUMENTS

| | | | | |
|---|---|---|---|---|
| 7,719,384 B1* | 5/2010 | Arceo | ............... | H01P 1/213 333/1.1 |
| 9,020,079 B2* | 4/2015 | Gupta | ............... | 375/343 |
| 2002/0173341 A1* | 11/2002 | Abdelmonem et al. | ...... | 455/561 |
| 2007/0222523 A1* | 9/2007 | Arell | ............... | H03F 1/0277 330/302 |
| 2010/0289579 A1* | 11/2010 | Cassia | ............... | H03F 3/19 330/251 |

* cited by examiner

HIGH FREQUENCY TRANSMITTERS AND RECEIVERS

RELATED APPLICATIONS

The present application is a continuation-in-part of U.S. patent application Ser. No. 13/155,979, filed Jun. 8, 2011, which is a non-provisional of U.S. Provisional Application Ser. No. 61/352,566, filed Jun. 8, 2010, and is a non-provisional of U.S. Provisional Application Ser. No. 61/405,307, filed Oct. 21, 2010, and is also a non-provisional of U.S. Provisional Application Ser. No. 61/429,709, filed Jan. 4, 2011. The contents of the above referenced applications are incorporated herein by reference in their entireties for all purposes.

FIELD OF THE DISCLOSURE

Aspects relate generally to high frequency (HF) antenna systems and more particularly to shipboard HF antenna systems for use in communication transmission systems.

BACKGROUND

Shipboard antennas often use HF frequencies that require the entire ship to act as an antenna. For particular HF frequencies, heretofore, it has not been possible to achieve any reasonable transmit efficiencies. This requires enormous transmit power and results in other problems such as interference with collocated receivers. Interference mechanisms take various forms such as cross-modulation, broadband noise radiation, desensitization, intermodulation, and spurious emissions. Devices that address many of these are the comb linear amplifier combiner (CLAC) and the comb limiter combiner (CLIC). CLAC's technique of putting the high-power amplifiers (HPAs) close to the antenna enables the use of lossy narrowband high Q filters that cleans up adjacent channel interference. CLIC's technique of putting at the front end of the receiver a bank of parallel bandpass filters having contiguously adjacent passbands that together span the entire bandwidth of the receiver enables reduction in adjacent channel interference. Thus collocated radios can tune closer in frequency, making more efficient use of the spectrum. Yet even more efficiency is achievable with the present aspects disclosed herein, which enhance the capabilities of CLIC and CLAC by attacking issues not previously or adequately addressed. In ship environments with multiple transmit and receive frequency ranges and/or antennas, these systems have not met satisfactory performance for high speed communications.

High Temperature Superconducting (HTS) material is comprised of an alloy of various exotic materials. They can reach zero resistance, and thus improve efficiency when used in a CLIC or CLAC. However, certain limitations of HTS alloys used in CLIC or CLAC systems have not previously been understood or addressed.

SUMMARY

A method is presented which solves several major problems of HF shipboard communications and to efficiently connect multiple high-power HF transmitters to a small number HF transmit antennas while simultaneously enabling the adequate reception of somewhat similar HF signals in the same co-site environment.

While the zero resistance of HTS alloys can improve efficiency in different systems generally (including CLIC and/or CLAC systems), various embodiments disclosed herein overcome certain limitations of CLIC and/or CLAC systems that use HTS alloys. HTS alloys can be power limited and non-linear when used in CLIC or CLAC systems. This may result in quenching and/or the generating of inter-modulation products, which can limit the performance and benefits of CLIC and/or CLAC. Quenching refers to the loss of superconduction when current density is greater than the quenching density level. These problems with HTS alloys in CLIC and/or CLAC systems have thus far not been addressed.

One or more embodiments may consolidate multiple HF signals onto one or two HF transmit antennas and one receive antenna. To accomplish this, numerous technical challenges must be overcome. For example, certain challenges relate to the short electrical distances between antennas and the short electrical lengths of antennas ultimately arising from the long wavelengths involved. For instance, the measured isolation between shipboard HF antennas falls between 15 dB and 50 dB. Given HF transmitter power levels as high as 4 kW, or +66 dBm, the receivers could possibly experience levels as high as 100 W or +50 dBm.

Additionally, there are a number of mechanisms that may degrade performance of the receivers given these high power levels. These mechanisms include, for example, desensitization, reciprocal mixing, cross-modulation, receiver narrowband spurious responses, transmitter narrowband spurious emissions, receiver inter-modulation, and transmitter inter-modulation. Each of these mechanisms can deny numerous communications channels.

A further problem associated with the short electrical lengths of many HF antennas is the impact of the highly capacitive impedance of the terminal impedance. FIG. 1, a plot of antenna impedance vs. frequency of a 15 foot horizontal dipole antenna, illustrates this effect. Note that the reactive impedance at 3 MHz is a negative (i.e., capacitive) 3,000 Ohms. This is an 18 dB mismatch with a 50 Ohm receiver or transmitter; meaning only about $\frac{1}{60}^{th}$ of the power reaches the antenna. However, by putting an inductor with a positive (i.e., inductive) 3,000 Ohm reactance in a matching unit, the insertion loss is theoretically eliminated. There is a catch however. To create sufficient inductance, many coil turns may be needed. Moreover, due to linearity and high current requirements, larger coil diameter air core inductors may be required. As a result the HF resistance is large, the insertion loss is typically greater than 14 dB, and only about $\frac{1}{25}^{th}$ of the transmitter power reaches the antenna. This is typical of the HF insertion losses the Navy is presently coping with.

Still further, the use of a standard comb limiter combiner (CLIC) and comb linear amplifier combiner (CLAC) can be wasteful of power due to the multiplicity of sub-bands needed to cover the entire HF band and the need to minimize the number of transmitters in the same sub-band for interference mitigation purposes. Each sub-band in standard CLIC and CLAC designs further utilize amplifiers, e.g., high power amplifiers (HPAs) for transmitting in the CLAC and lower power amplifiers (LPAs) for receiving in the CLIC. The HPAs and LPAs further waste power and reduce performance when a subband is not being utilized, because, for example, they amplify and propagate unintended cross-modulation noise.

HF ambient noise levels on Navy ships are much higher than receiver noise levels. Thus, HF receive-system antennas are sometimes designed with a negative gain vs. frequency characteristic that is inversely proportional to the "quasi-minimum" ambient-noise spectrum. The negative gain is such that the ambient noise is reduced to approximately the receiver noise level (thus receive sensitivity is not degraded). This designed receive antenna loss has the added advantage that the undesired power levels from collocated shipboard transmitters are greatly reduced.

In consideration of the various issues in CLIC and CLAC designs noted above, various embodiments disclosed herein utilize CLAC output filters and/or CLIC input filters that have been redesigned for matching antenna and transmitter/receivers impedances as well as being band pass filters (BPFs) so that antenna and ship effects are part of the filter characteristics and inter-subband coupling is minimized. Additionally, in certain embodiments, cryogenically cooled pure copper components may be used for the matching units and filters, to reduce (or potentially to essentially eliminate) the high insertion loss usually associated with HF antenna systems.

One or more embodiments use cooled air core, pure copper inductors in CLIC and/or CLAC matching units/filters. While the resistivity of copper may be significantly greater than HTS materials that could be used, when using pure copper that has been cryogenically cooled, the resistivity is reduced to the extent that intermodulation issues become the predominate limiting factor in performance. As such, the cooled air-core, pure copper inductors reduce insertion loss through reduced resistance, and further provide advantages over HTS materials in that the pure copper design does not suffer from quenching signals beyond the HTS materials capacity and does not cause as many intermodulation issues. Thus, they achieve improved performance, e.g., higher Q and lower insertion loss leading to steeper rolloff, consequently more channels with low insertion loss and much lower in-channel insertion losses.

Further, cryogenic cooling and/or high-temperature super conduction may be used for the HPAs in the CLAC and/or may be used for the LPAs in the CLIC to reduce amplifier broadband noise levels, thereby enabling use of electrically closer transmit and receive antennas. Additionally or alternatively, pure copper may be used in the HPAs and/or LPAs.

In certain embodiments, a control unit may be used to switch CLAC HPAs on/off and/or to switch between low power/high power modes and/or to change sub-band placement of the HPA to improve (and potentially maximize) system efficiency. This will bring down the required number of active high-power amplifiers (HPAs) to about the number of transmitters times the average transmit duty cycle, a potentially huge power savings. Turning off a sub band amplifier not in use in the CLAC transmitter will have the added benefit of blocking noise and spurious emissions from leaving the transmit antenna at any frequency in that sub band passband containing the amplifier that has been turned off. Since shipboard receivers may be using those frequencies, any effect of turning off the CLAC sub band can only improve the electromagnetic compatibility of the situation.

In some embodiments, a control unit may be used to switch CLIC LPAs on/off and/or to change sub-band placement. By doing so, in subbands not being used (e.g., because they are being used by the transmit antenna), noise and unintended signals are not amplified and propagated into the receiver system. This may eliminate or reduce the need to design in receiver antenna loss (the negative gain vs. frequency characteristic noted above). Further significant power savings may be achieved by effectively turning off amplifiers not in use at any given instant or automatically switching the amplifier to a sub-band where it is needed.

For CLIC and/or CLAC amplifiers, switching may be automatically performed by the control unit based on the signals being transmitted/received. For example, given 4 transmitters are in use, theoretically only 4 sub-bands need amplification (unless transmission near sub-band crossover frequencies is present). Thus, computerized control of these switching features may be utilized.

In addition, various embodiments may include exciter carriers that are bandpass filtered as well, which may to a great extent, suppress the out of band spurious and noise. The use of sub banding associated with CLIC and/or CLAC and frequency agile filters at the receiver inputs and the transmitter outputs, with careful design, will maximize the number of radios that can be accommodated by mitigating virtually all of the interference mechanisms associated with topside design, save a few such as "rusty bolt inter-modulation."

BRIEF DESCRIPTION OF THE DRAWINGS

A more complete understanding of the disclosure and the advantages thereof may be acquired by referring to the following description in consideration of the accompanying drawings, in which like reference numbers indicate like features, and wherein.

DETAILED DESCRIPTION

Figure 1:
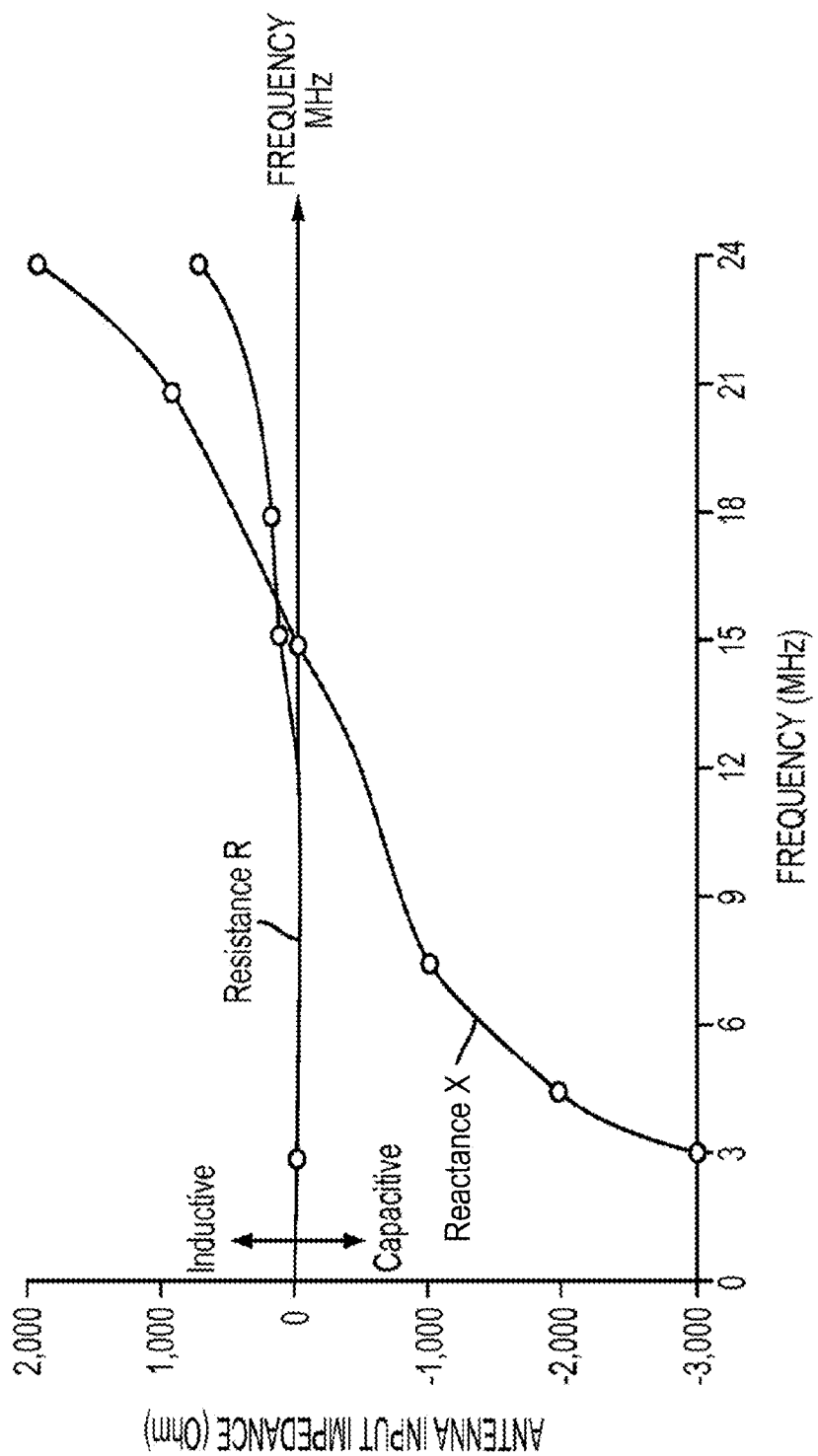
FIG. 1 is a graph illustrating the terminal impedance of an antenna in accordance with certain aspects.

High frequency (HF) antennas are notoriously not amenable to efficient operation using conventional methods. For example, FIG. 1 illustrates the terminal impedance of an antenna. This plot may represent a 10 meter "half-wave" dipole antenna. This antenna can be used at 15 MHz without a matching network. This is because its impedance at 15 MHz is close to 50 Ohms. Note that the reactive part of the impedance is approximately zero at 15 MHz and the real part is close to 50 Ohms. Thus it is a good match to typical transmitter output stages, resulting in high efficiency transmission. However, most HF antennas used at the low end of the HF band are very reactive. At 3 MHz, FIG. 1 indicates a negative (i.e. capacitive) reactance of 3,000 Ohms. For efficient operation, this requires a positive (i.e. inductive) reactance of +3000 Ohms in series with the −3,000 Ohm antenna. This may be achieved by a large and typically lossy inductor, resulting in low efficiency. Because of such things, less than 5% of a transmitter's power may reach the HF antenna at these frequencies.

Figure 2:
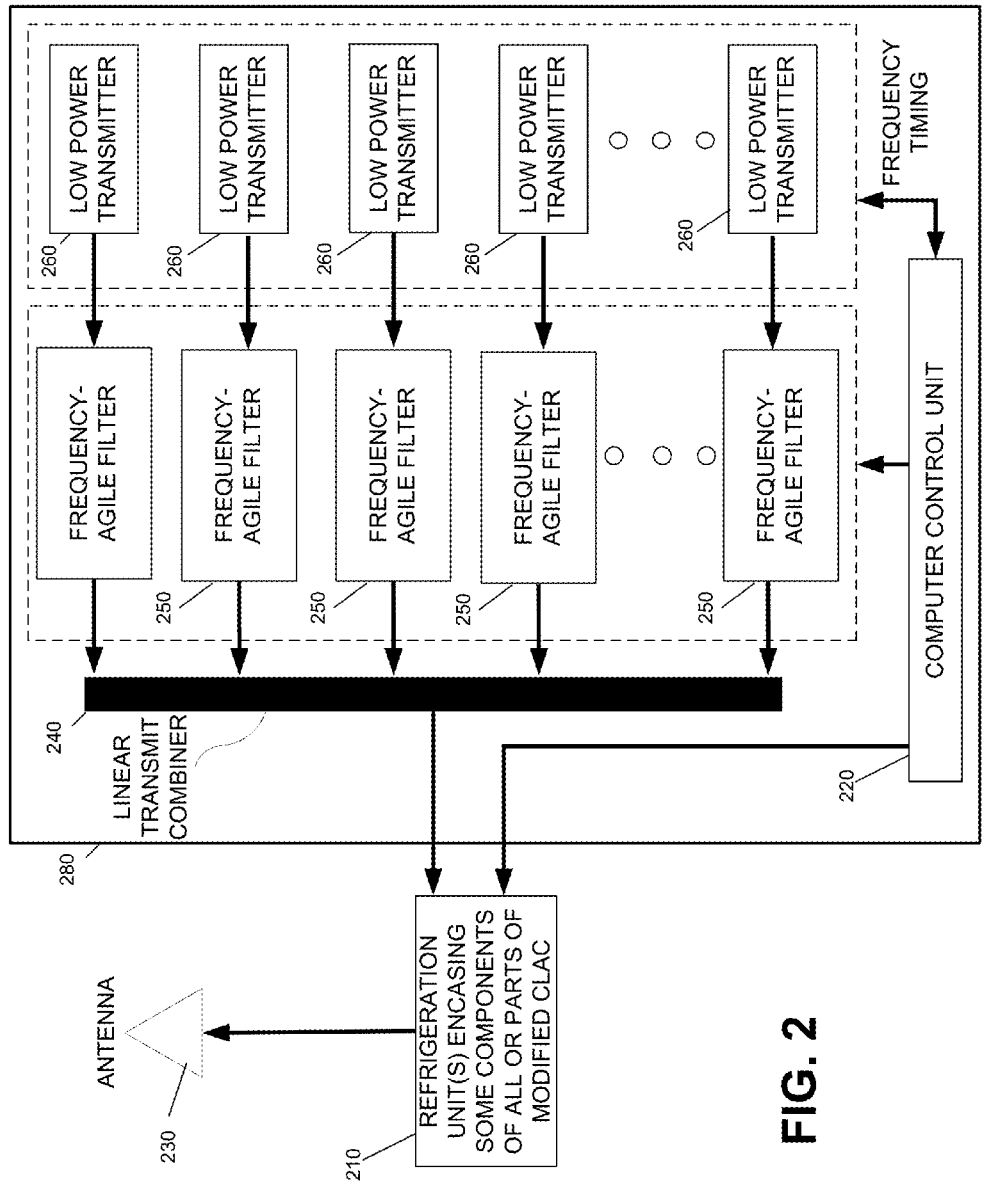
FIG. 2 is a block diagram showing a transmitter circuit in accordance with certain aspects.
Figure 3:
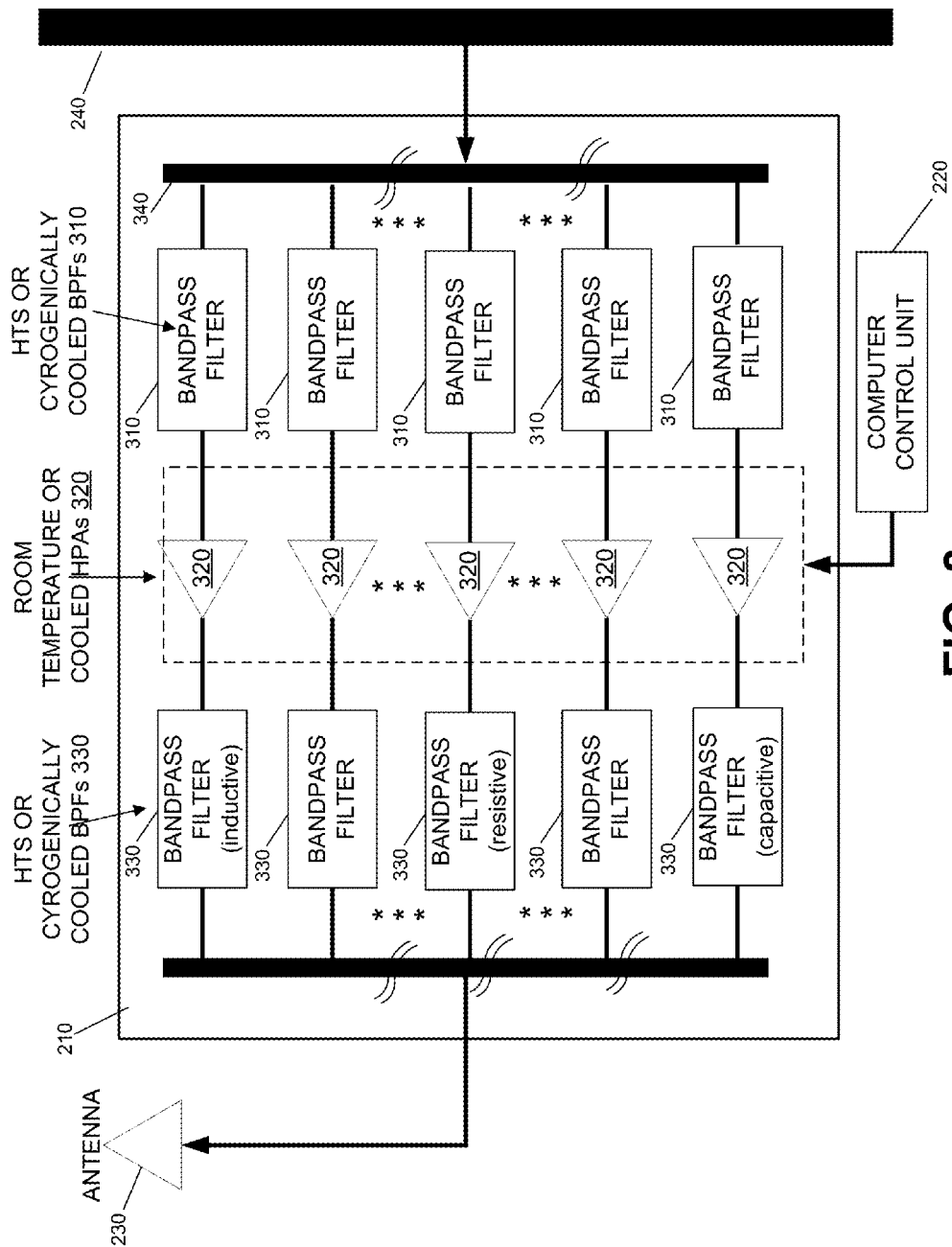
FIG. 3 is a block diagram of a modified comb linear amplifier combiner (MCLAC), in accordance with certain aspects.

In some embodiments, the fraction of power reaching the antenna may be increased to around 50% or even more (e.g., as much as 95%). For example, as shown in FIGS. 2 and 3, the use of cryogenically cooled pure copper and/or HTS air-core core inductors in the output stage of each sub-band of a comb linear amplifier combiner (CLAC) may be employed to provide this efficiency. In addition, the inductors as used herein to match, or cancel, the capacitive reactance of the antennas may be very linear to avoid generation of intermodulation (IM) products. Hence cored inductors will not function nearly as well as air-core inductors. This cryogenically cooled pure copper or HTS coil allows the device to operate at high efficiency even where the lossy nature of a conventional coil will only operate at low efficiencies. Thus, to cancel the high reactive impedance of HF antennas at low frequencies, many coil turns are needed driving up the HF resistance of the wire. This can be the primary source of the insertion loss of the coil.

Research done previously examined the cause of the insertion loss caused by the combination of a specific tuning unit and an HF antenna resulting in 95% insertion loss in the transmitter's available power. The study revealed that the power loss was primarily due to the inductor's HF resistance.

Thus the insertion loss could be largely resolved by reducing or eliminating this resistance through the use of cryogenically cooled pure copper or HTS materials in an air core inductor. Conventional means are not efficient. For example, use of ferrite cores could enable reduced wire length but the high transmit power would result in nonlinear intermodulation products in the cores. Further, while the diameter of conductor used for an inductor could be increased, the dimensions of the inductor (and resulting resistance) are fixed by the circumstances of space, antenna reactance and transmit power.

Previous patents of a comb linear amplifier combiner (see, U.S. Pat. No. 6,211,732 "CLAC Patent") and a comb limiter combiner (see U.S. Pat. No. 6,549,560 "CLIC Patent"), are herein incorporated by reference in their entireties.

The term HTS refers to materials that have super-conduction properties at temperatures above that which liquid nitrogen provides sufficient cooling. As also used herein, pure copper refers to high purity copper, e.g., unalloyed copper, copper having a purity of greater than 99%, etc. For example, various embodiments may include commercially pure C10100 to C13000 (UNS) copper (e.g., oxygen free copper). Pure Copper may, for example, have purity of 99.3% or greater, 99.5% or greater, 99.7% or greater, 99.9% or greater, or 99.95% or greater, and/or have residual resistivity values of at least 30 (e.g., 30, 50, 100, 400). Various examples may include pure copper having greater than 100% IACS (International Annealed Copper Standard) conductivity (e.g., 101%, 103% IACS).

The CLAC system allows multiple transmitters to transmit through one antenna 230. While this works well for many applications, at certain HF frequencies, it is very inefficient requiring tremendous transmit power and results in undesirable noise. Referring to FIG. 3, the CLAC 210 passes low powered transmit signals through a bank of bandpass filters 310. The transmit signals then pass through a bank of amplifiers 320 (e.g., class A amplifiers) which amplify the transmit signals to full transmit power. Without cooling, the amplifiers 320 may generate broadband noise levels as determined by the amplifier noise temperature, close to 300 degrees Kelvin. In various embodiments, the amplifiers are cooled (e.g., cryogenically cooled), which can reduce that level by about 7 dB. This results in noise levels seen at the input of collocated receivers also being reduced. Assume, for example, that typical isolations between HF transmit and collocated receive antennas are around 25 dB. Further assume, for example, the receiver noise figure and HPA noise figures are comparable. The radiated HPA noise levels exceed room temperature by approximately the HPA (including pre-amps) power gain. Say, for example, 40 dB is the least required. To mitigate receiver signal masking by the CLAC amplifiers, the cooling is desirable. The full transmit powers are then transmitted through a single transmission antenna 230. Embodiments include utilizing cryogenically cooled pure copper or HTS bandpass filter matching units between the combiner and the high-power amplifiers 320. See FIG. 3. These filters include the antenna itself and its impedance as part of each BPF design. Because the wavelengths of frequencies in this band are near the ship's dimensions, the ship itself forms part of the antenna. Because of this, the antenna/ship characteristics are included in the design of the BPF and may be part of the filter.

The bank of output BPFs 330 are designed to include the antenna impedance to the extent it matches the impedance of the antenna/ship 230. In FIG. 3, the top BPF 330 passes signals in the segment at the low end of the HF band (e.g., 3 MHz) where the antenna impedance is very capacitive. Thus the filter is labeled inductive at resonance to indicate it cancels the capacitive reactance of the antenna/ship. The bottom BPF 330 passes signals in the segment at the high end of the HF band (e.g., 30 MHz) where the antenna impedance is very inductive. Thus the filter is labeled capacitive at resonance to indicate it cancels the capacitive reactance of the antenna/ship. Middle BPF 330 passes signals in the segment at near the middle of the HF band (e.g., 15 MHz) where the antenna impedance is predominantly resistive. Thus the filter is labeled resistive at resonance to indicate it cancels the capacitive reactance of the antenna/ship. The outputs of the BPFs 330 are combined in a high power linear combiner and coupled to the antenna 230.

The embodiments shown in FIGS. 2 and 3 clean up spectral skirts and reduce RAS effects, RIM, TIM, SE and SR. Referring to FIG. 3, the cryogenically cooled pure copper or HTS inductive-resonance BPF 330, resistive-resonance BPF 330, and Capacitive Resonance BPF 330, and other BPFs 330 tuned at resonance frequencies in between are chosen in accordance with the parameters specified in FIG. 1. In one example, 30 contiguous bandpass filters spaced at 5% of the 2-9 MHZ band may be utilized. In other embodiments, 30 contiguous bandpass filters spaced at 5% of the 9-30 MHZ band may be utilized. In this manner, the combined low-power transmit signals split up by following the path of least resistance through the BPF(s) affording the least frequency rejection. The signals in each sub-band are amplified by the HPA 320 in the sub-band. If no signals are in a sub-band, or relatively close in frequency in an adjacent sub-band, the direct current (DC) power to that HPA 320 is effectively eliminated until such signal(s) are present.

As stated before, the HTS or cryogenically cooled pure copper filters enable the elimination of the extremely high insertion loss of the filter which would otherwise occur. In previous CLIC and CLAC architectures, in addition to the high insertion loss due to resistance in the inductors, significant frequency band is wasted due to the bull nose shape of the pass-band near resonance and high cross over frequencies between adjacent band pass filters. The use of HTS alloys in the filter inductors greatly reduces the resistance and the above mentioned negative effects, making HTS suitable for some applications where required transmit power is limited. However, as previously noted, HTS alloys suffer from non-linear effects caused, for example, by ferromagnetic materials in the alloys. The non-linear effects result in some intermodulation of signals. As further noted, HTS alloys suffer from quenching at high powers. For example, many HTS alloys lose their superconductivity at less than 25 W, with 5 W being common, depending on the particular alloy and inductor circuit configuration. Thus, while use of HTS in the filters improves performance, there are limits to its use.

Various embodiments overcome the HTS limitations by using pure copper that is cryogenically cooled (e.g., to 77 degrees Kelvin using liquid nitrogen) instead of using HTS alloys. While HTS materials can also be cooled to bring the materials essentially to zero ohms, the cooling does not eliminate the non-linearities or the quenching issues. By cryogenically cooling pure cooper to 77 degree Kelvin, resistivity of the copper can be reduced by a factor of approximately 8. By dropping resistivity (and thus resistance), so significantly, filters with sufficiently high Q-factor can be created resulting in a near box car BPF profile that doesn't have the power limitations of HTS alloys. Cryogenic cooling pure copper, in some examples, reduce insertion loss of the BPF (e.g., a 7-section Butterworth filter), which can be less than 0.5 dB (Fc=3 MHz, Bandwidth=5%) with rejection of greater than 42 dB at +1-5% of the center frequency. Further, because pure copper almost entirely lacks ferrous materials or other impurities, non-linearities, and thus intermodulation in the filter, are almost entirely eliminated, e.g., below quasi minimum noise for many ship applications.

The HPAs 320 may include HTS or cryogenically cooled pure copper so as to greatly reduce its broadband noise level, enabling closer spacing of transmit and receive antennas. Should two signals appear in the same sub-band at the same time, intermodulation products could result in denying communications channels for use. To avoid this, the output BPF filter bank is used.

The CLAC further includes BPFs 310 that in various embodiments may include HTS or cryogenically cooled pure copper. The pass bands of BPFs 310 may match those of the BPFs 330 in the same signal path. The BPFs 310, however, handle much lower power than BPFs 330. Various designs may limit the power to BPFs 310 below HTS quenching power limits. Accordingly, various embodiments may use HTS in BPFs 310 combined with cryogenically cooled pure copper in BPFs 330. The HTS in BPFs 310 may be cryogenically cooled as well. Notwithstanding the lower power requirements of BPFs 310 that reduces HTS quenching issues, various embodiments may alternatively use the cryogenically cooled pure cooper in BPFs 310 to further reduce intermodulation to below that of HTS. The BPFs 310 receive the transmit signals from a splitter 340 that receives a combined signal from a combiner 240 in a previous exciter-combiner circuit 280 illustrated in FIG. 2. In various embodiments, combiner 240 and splitter 340 may be integrated as a single device. Referring to FIG. 2, a computer control unit 220 (may be coupled to the CLAC 210, one or more (e.g. all) of the frequency agile filters 250, and one or more (e.g., all) of the low power transmitters 260 (optionally including pre-amplifiers at their outputs). In this configuration, the computer control unit 220 may control the low power transmitters 260 both as to activation, phase, and power as well as the frequency agile filters 250. Using this control, the number of transmitters 260 and filters 250 utilized is controlled to equal to the number of subbands being transmitted. The transmitters and frequency agile filters utilized are respectively tuned to the transmitted subbands, and the unused transmitters and frequency agile filters may be power off, which minimizes spurious noise being transmitted to the CLAC stage. The frequency agile filters 250 may be controlled via a digital or analog signal. The frequency agile filters 250 and other components in FIG. 2 may comprise HTS or cryogenically cooled pure copper components. Like BPFs 310, HTS quenching may not be an issue due to the low power. However, certain embodiments may include the cryogenically cooled pure copper components to eliminate intermodulation (IM) interference that may otherwise arise from using HTS.

Part of the information coming from the low power transmitters 260 may include the frequency of the next signal coming through. The computer control unit 220 may use this information by tacking metadata onto the signal going into the frequency agile filter 250 to track the signal as it is processed by the HPA 320. Once the last signal at a given frequency passes, the computer control unit 220 minimizes power to that HPA 320 until its frequency is again required. The metadata may be modulated on the signal and/or sent before or after the signal. The computer control unit 220 may be an integrated circuit such as a microprocessor, one or more signal processing units, and one or more interface circuits.

FIG. 2-3 illustrate one CLAC and exciter/combiner combination, however, multiple sets of each combination may be used simultaneously to cover multiple frequency ranges. For example, one circuit set may be designed for the frequency range of 2-9 MHz and another circuit set may be designed for the frequency range between 9-30 MHz. Each transmitter circuit set may incorporate its own antenna, or additional high power linear combiners may be used to combine the outputs of the two set into one antenna.

Figure 4:
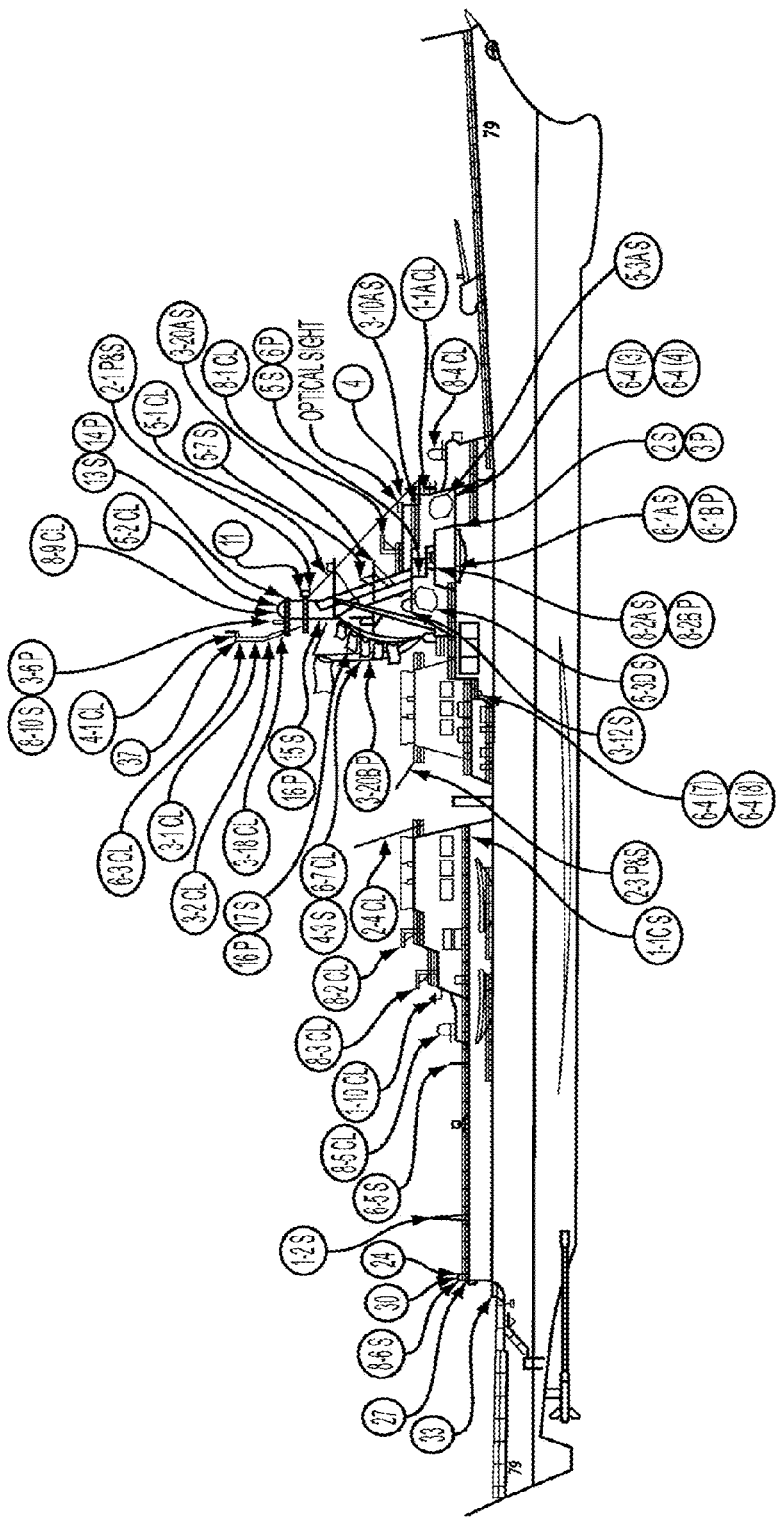
FIG. 4 is an illustrative diagram indicating the co-location of multiple shipboard antennas, in accordance with certain aspects.

As shown in FIG. 4, Navy ships often accommodate many antennas which often lead to a number of problems. Packing antennas close together results in interference to the various systems. The closeness means that the power from a collocated transmitter in a "victim receiver's channel" is likely to exceed the power of the signal the receiver is trying to detect from a far away transmitter. This is generally termed the "near-far" problem. Spreading out the shipboard antennas can help to alleviate this problem, but that requires fewer shipboard antennas. CLAC accomplishes that. Because of the near-far problem, many channels are denied to the communications systems on board.

Figure 5:
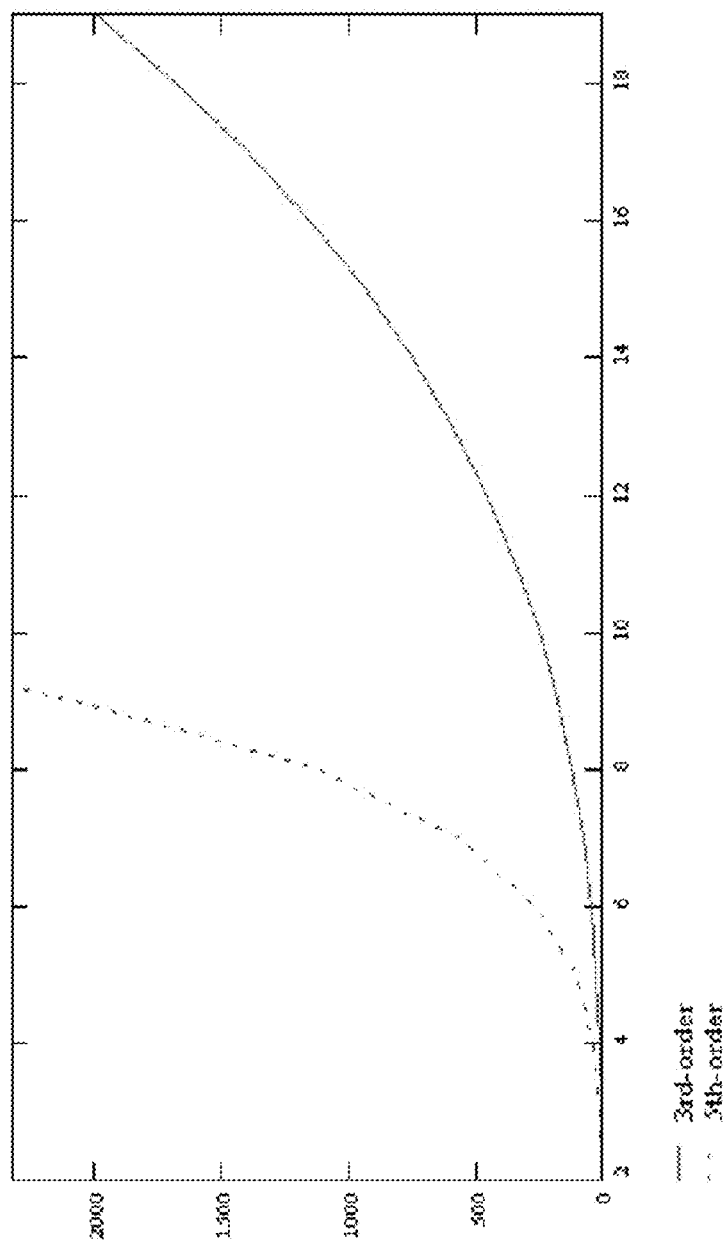
FIG. 5 is a graph illustrating an exponential growth of the number of HF channels containing an intermodulation product carrier if, for example, all signals passed through the same single broadband amplifier.

Compounding this problem, the Navy would like to deploy many additional automatic link establishment (ALE) systems. These systems check availability of channels and rapidly change frequency when advantageous. Without careful attention to determination of interference-free channels readily available with fixed tuned radios, ALE results in potential system degradation in communications range from the presence of inter-modulation products. Intermodulation products result when two or more high-power signals pass through the same non-linear device at the same time. FIG. 5 illustrates the exponential growth of the number of HF channels containing an intermodulation product carrier if, for example, all signals passed through the same broadband amplifier. The number of HF transmitters on board and radiating typically exceeds 5. From FIG. 5 we see (adding the two curves) that the number of channels denied just from $3^{rd}$ and $5^{th}$ order intermodulation (many higher order products could be significant) would exceed one or two hundred out of the 1,100 available. The picture is much bleaker however, as each product denies somewhere around 5 channels due to spectral spreading which is characteristic of intermodulation-product signals. Thus various aspects are useful in embodiments where it is desirable to prevent high-power nonlinear device coupling between transmitters.

Figure 6:
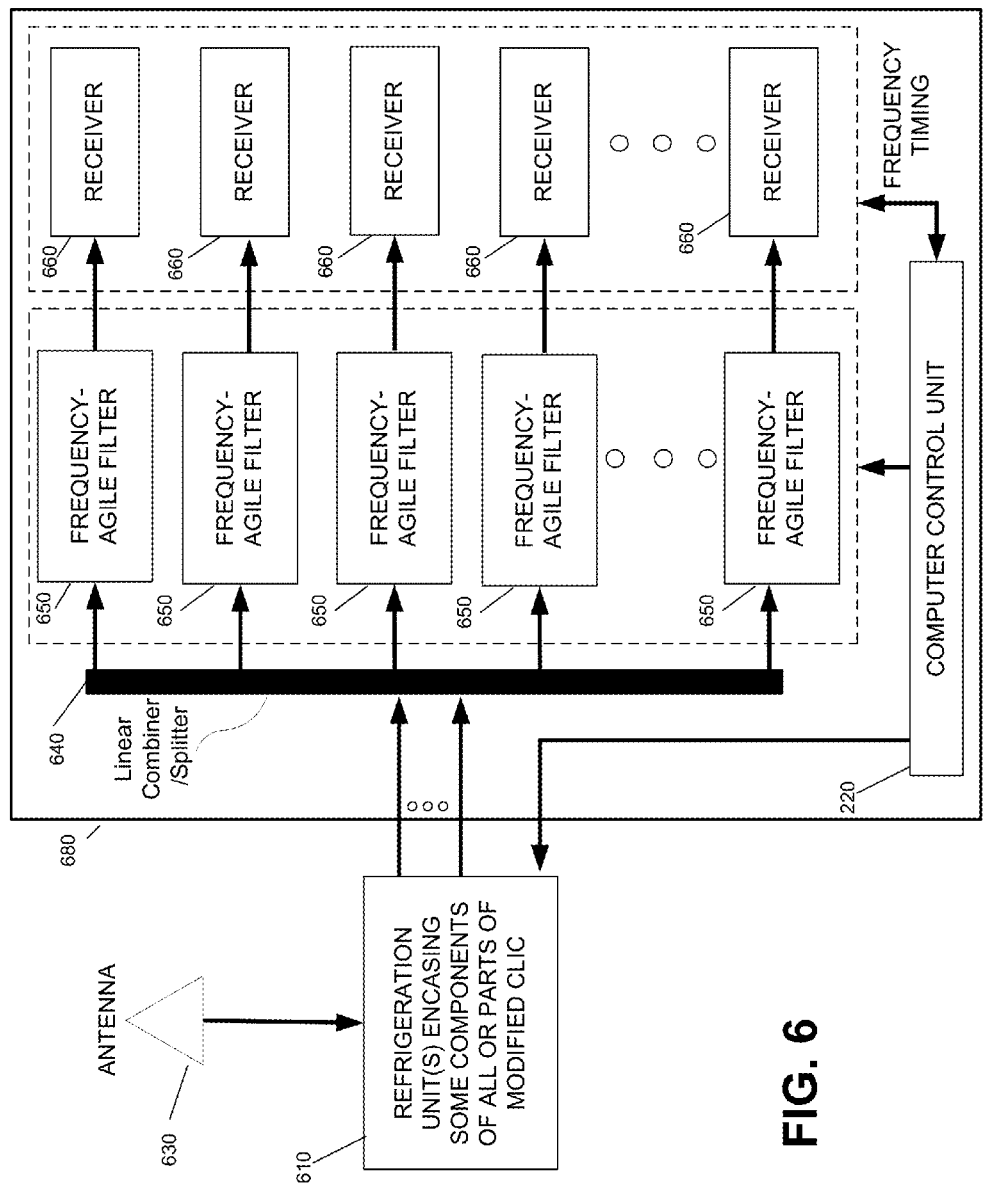
FIG. 6 is a block diagram showing a receiver circuit in accordance with certain aspects.
Figure 7:
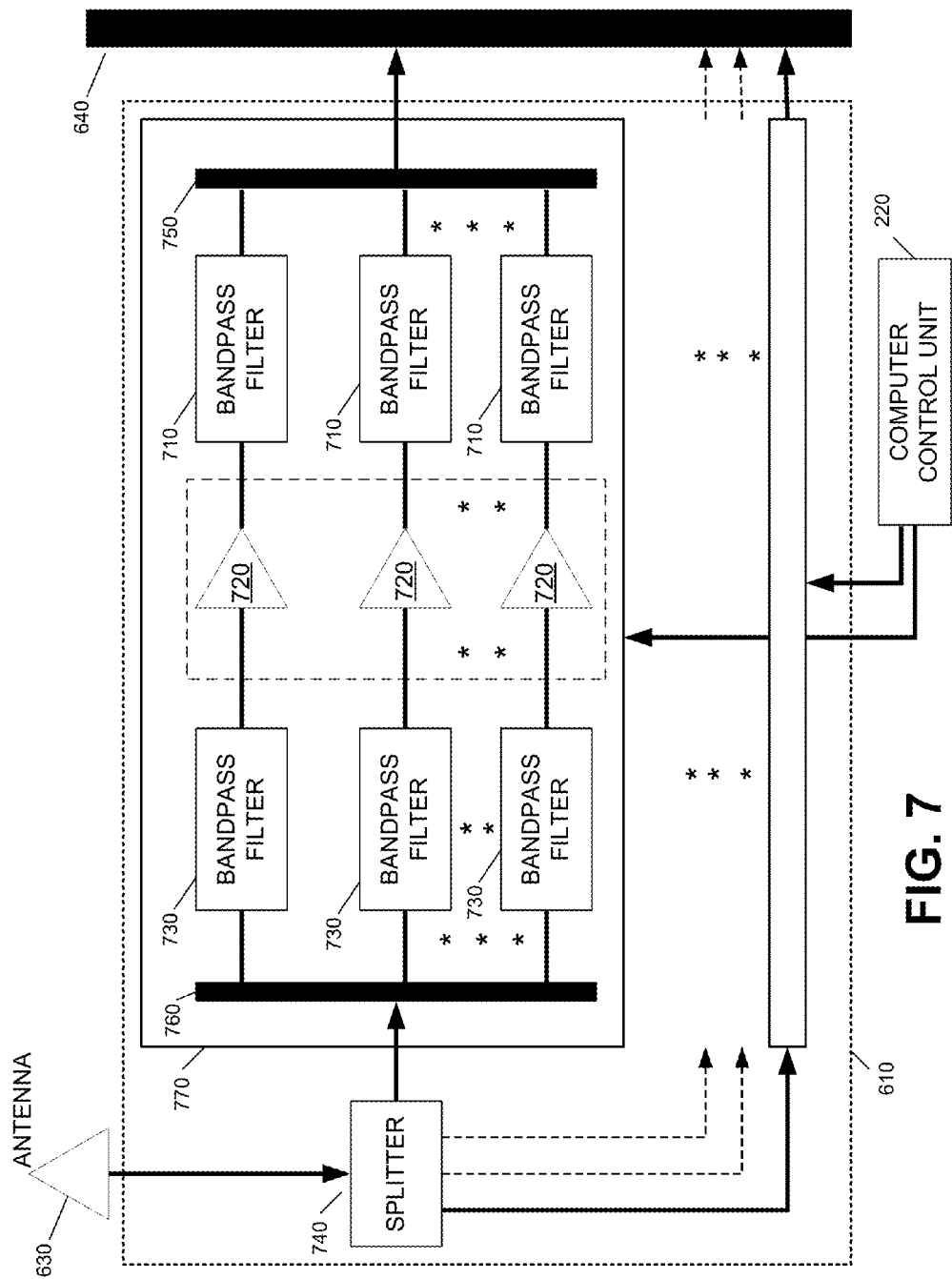
FIG. 7 is a block diagram of a modified comb limiter combiner (MCLIC), in accordance with certain aspects.

To further or independently improve system performance, FIGS. 6-7 illustrate a receiver system that complements the transmitter system illustrated in FIGS. 2-3. FIG. 6 is a block diagram showing a receive signal splitter circuit in accordance with certain aspects, and FIG. 7 is a block diagram of a modified comb limiter combiner (MCLIC), in accordance with certain aspects. The FIGS. 6-7 architecture closely mirrors that of FIGS. 2-3, except that the power levels in the receive signals are much lower. Accordingly, various embodiments may incorporate HTS alloys used in a similar fashion as in the transmitter circuit, but without the issue for quenching due to high signal powers. Other embodiments may alternatively incorporate cryogenically cooled pure cooper to provide similar benefits as HTS, but with less intermodulation interference caused by non-linearities in the HTS materials.

Starting with FIG. 6, receive antenna 630 receives one or more carrier signals and couples those signals to modified CLIC system 610. The modified CLIC may include HTS and/or cryogenically cooled pure copper in some or all of the CLIC components. The MCLIC may have one or more outputs, with each output carrying a specified frequency range of signals. For example, one output may carry signals in the 2 MHz to 9 MHz range and a second output may carry signals in the 9 MHz to 30 MHz range. Splitting the operating frequency range into multiple regions prevents multiple CLICs from cross-loading each other. The outputs of CLIC system 610 may be fed into one or more linear combiners/splitters 640 of a receive signal splitter circuit 680. Each combiner/splitter 640 may combine multiple outputs from the CLIC system 610 or each combiner/splitter receive one output from the CLIC, and then output the received signals to a number of frequency agile filters 650.

The computer control unit 220 may be coupled to the CLIC system 610, one or more (e.g. all) of a bank of frequency agile filters 650, and one or more (e.g., all) of a bank of low power receivers 660. In this configuration, the computer control unit 220 may control the low power receivers 660 both as to activation, phase, and power as well as the frequency agile filters 650. Using this control, the number of receivers 660 and filters 650 utilized is controlled to equal to the number of subbands being received. The receivers (e.g., digital modular radios) and frequency agile filters utilized are respectively tuned to the received subbands, and the unused receivers and frequency agile filters may be power off, which minimizes spurious noise being received. The frequency agile filters 650 may be controlled via a digital or analog signal. The frequency agile filters 650 and other components in FIG. 6 may comprise HTS or cryogenically cooled pure copper components.

For example, frequency agile filters 650 (e.g., 7 step Butterworth bandpass filter) may be built with HTS or cryogenically cooled pure copper inductors similar to the frequency agile filters 250 in FIG. 2. The power received by filters 650 may be low-power (e.g., less than 5 W), and thus quenching in HTS components is not an issue. However, while HTS components may provide lower insertion loss due to lower resistance, certain embodiments that include cryogenically cooled pure copper may provide superior intermodulation performance because of its greater linearity, while also providing sufficiently low insertion loss.

FIG. 6 illustrates one receive signal splitter circuit 680, however, multiple receive signal splitter circuits may be used simultaneously to cover multiple frequency ranges. Each may receive an input from the same modified CLIC system 610 in the antenna 630, or each receive signal splitter circuit may receive its inputs from a different CLIC system 610 and antenna 630 to cover a full frequency spectrum (e.g., 0-30 MHz). For example, one circuit set may be designed for the frequency range of 2-9 MHz and another circuit set may be designed for the frequency range between 9-30 MHz.

Details of the modified CLIC system 610 are illustrated in FIG. 7. Modified CLIC allows for multiple carrier signals to be received through one antenna 630, minimizes or eliminates interference (e.g., cross-modulation) between the carriers by separating the signals with bandpass filters tuned to adjacent frequency ranges.

Signals received by antenna 630 may first be fed to a high-pass, low-pass, or band past splitter 740 that separates the signals into multiple frequency ranges. For example, the splitter may have three outputs with the first output carrying signals from 0.14 MHz through 2 MHz, the second output carrying signals from 2 MHz through 9 MHz, in the third output carrying signals from 9 MHz through 30 MHz. Each of these outputs may be fed through a separate CLIC circuit 770 or directly to the combiners/splitters 640 of FIG. 2 (e.g., signals below 2 MHz may not need the CLIC circuit). Splitter 740 may comprise HTS or cryogenically cooled pure copper components (e.g., inductors) to reduce insertion loss and or reduce interference (e.g., due to intermodulation).

CLIC circuit 770 receives the output from the splitter 740, and distributes the signal using its own splitter 760 to a bank of bandpass filters 730. In various embodiments, splitter 740 may be integrated with splitter 760 in any or all of units 770. The receive signals then pass through a bank of amplifiers 720 (e.g., LPAs) which amplify the receive signals. The amplified signals then pass through a bank of output bandpass filters 710 and are recombined with a combiner 750 and sent to the circuit FIG. 6. In various embodiments, combiner 750 may be integrated with splitter 640.

The bank of BPFs 730 are designed to include the splitters 740/760 and antenna 630 impedance to the extent it matches the impedance of the antenna/ship 630. Assume, for example that the illustrated CLIC circuit 770 receives signals from the splitter 740 in the 2 MHz through 9 MHz range. In FIG. 7, the top BPF 730 passes signals in the segment at the low end of the frequency band (e.g., 2 MHz) where the antenna impedance is very capacitive. Thus the filter would be inductive at resonance to indicate to cancel the capacitive reactance of the antenna/ship. The bottom BPF 730 passes signals at the high end of the frequency band (e.g., 9 MHz) where the antenna is still capacitive but less so than the 2 MHz BPF 730. Thus, this filter would also be considered inductive at resonance. Each BPF 730 would be designed for it specific frequency band. In one example, 30 contiguous BPFs 730 space that 5% of the 2 to 9 MHz band may be utilized in one modified CLIC circuit 770, and another 30 contiguous BPFs 730 spaced at 5% of the 9 MHz to 30 MHz band may be utilized in an adjacent modified CLIC circuit 770. In various embodiments, the sub-band filtering (e.g., in BPFs, 310, 330, 710, and/or 730) may have bandwidths equal (e.g., approximately) to the TX/RX guard band of the communication protocol. Additionally, each output bandpass filter of the bank of output bandpass filters 710 is impedance matched at a different frequency subband of the plurality of frequency subbands to a common antenna (e.g., antenna/ship 630).

BPFs 730 may include HTS alloys and/or cryogenically cooled pure copper components (e.g., inductors). Various embodiments overcome HTS limitations in BPFs 730 by using pure copper that is cryogenically cooled (e.g., to 77 degrees Kelvin using liquid nitrogen) instead of using HTS alloys. As noted above, cryogenically cooling pure copper can reduce resistivity by approximately a factor of 8, resulting in BPFs 730 with sufficiently high Q-factor with a near box car BPF profile. Cryogenic cooling pure copper, in some examples, reduce insertion loss of the BPF (e.g., a 7-section Butterworth filter), which can be less than 0.5 dB (Fc=3 MHz, Bandwidth=5%) with rejection of greater than 42 dB at +/−5% of the center frequency. Further, because pure copper almost entirely lacks ferrous materials or other impurities, non-linearities, and thus intermodulation in the filter, are almost entirely eliminated.

LPAs (e.g., low noise amplifiers (LNAs)) may be cryogenically cooled and/or also include HTS or pure copper. Without cooling, the LPAs 720 may generate broadband noise levels as determined by the amplifier noise temperature, close to 300 degrees Kelvin. In various embodiments, the amplifiers are cooled (e.g., cryogenically cooled), which can reduce that level by about 7 dB.

Two signals may appear in the same sub-band (i.e., passed through the same BPF 730 and LPAs 720) at the same time, which could result in intermodulation products denying communications channels for use. To avoid this, filter bank of BPFs 710 may optionally be included to filter such 1M noise. The BPFs 710 may include HTS and/or cryogenically cooled pure copper similar to BPFs 730. The pass bands of BPFs 710 may match those of the BPFs 730 in the same signal path. Various embodiments may use HTS in BPFs 730 combined with cryogenically cooled pure copper in BPFs 710. Various embodiments may alternatively use the cryogenically cooled pure copper in BPFs 710 and 730 to further reduce intermodulation to below that of HTS. The HTS in BPFs 710 or 730 may be cryogenically cooled as well. If the BPFs 710 are not included in the design, the outputs of the amplifiers 720 may be connected directly to the signal combiner.

The computer control unit 220 may control the LPAs 720 both as to activation, phase, and power. Using this control, the number of LPAs 710 utilized is controlled to equal to the number of subbands being received, similar to the control of the receivers 660. Part of the information decoded by receivers 660 may include the frequency of the next signal coming through. The computer control unit 220 may minimize power (e.g., turn off) the LPAs 720, frequency agile filters 650 and receivers 660. Turning off some of these devices reduces spurious responses, interfering carriers, and other related issues (e.g., desensitization, intermodulation, etc.) from propagating in any subbands, except those being used.

Figure 8:
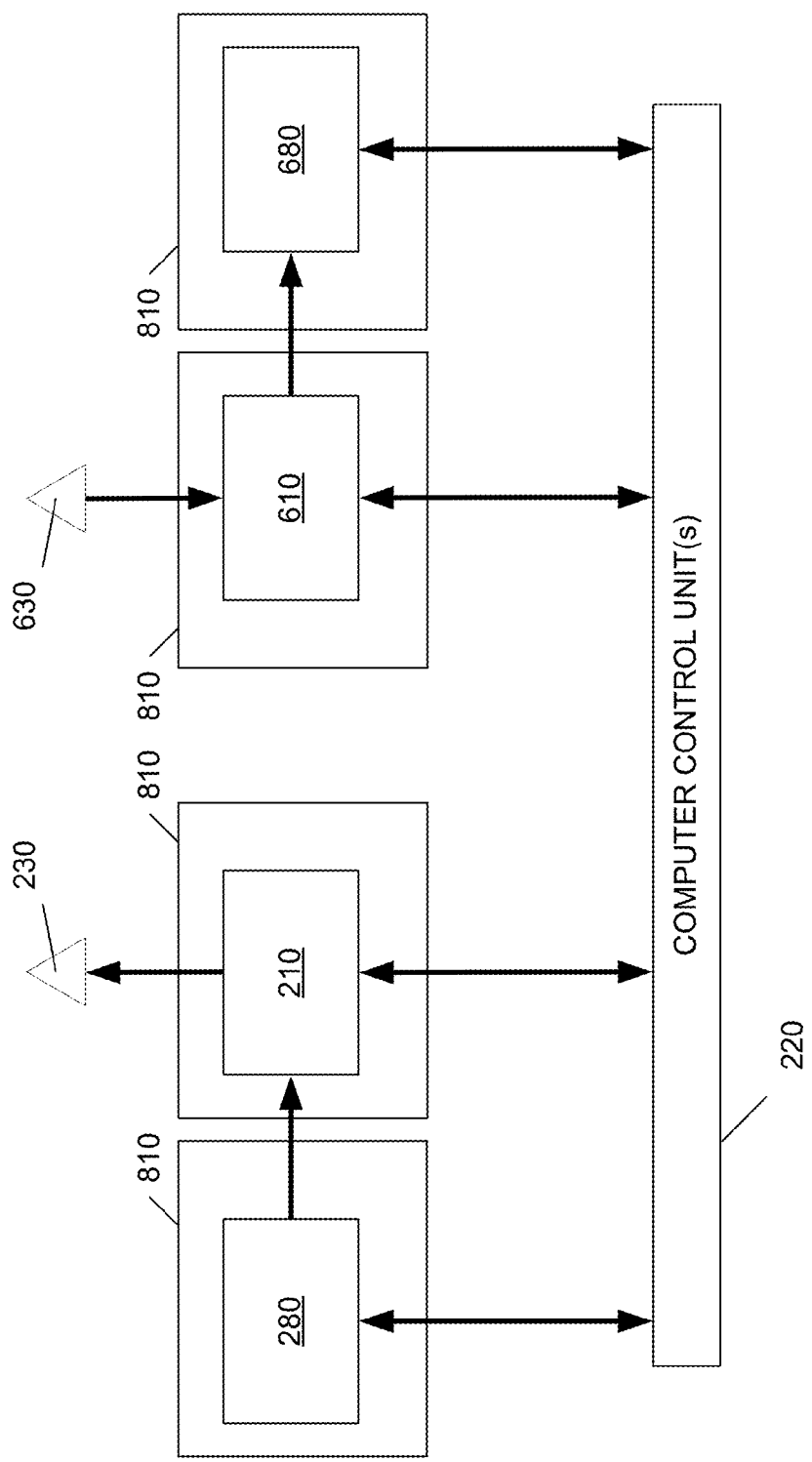
FIG. 8 illustrates a transmitter and receiver system in accordance with various aspects.

FIG. 8 illustrates various embodiments that include using the CLAC system illustrated in FIGS. 2 and 3 with the CLIC system illustrated in FIGS. 6 and 7. For example, the 2 systems could be co-located together on a ship such as the one illustrated in FIG. 4. In such embodiments, each of the subsystems 210, 280, 610, and 680 may be controlled with multiple computer control units 220 or may be controlled with a single computer control unit.

In various embodiments, control units 220 maintain a guard band (e.g., 5%) that prevents the transmitter from transmitting in any sub-band being utilized by the receiver. Having this guard band along with the ability to shut down an LPA in any particular subband (having similar bandwidth to the guard band) may prevent all interference signals from the transmitter antenna propagating through the receiver system. For another example, the guard band prevents carriers from collocated transmitters from operating in the same subband as an active receiver 660. Further, e.g., at the location of transmitter system 210, sub band HPAs (not necessarily in the sub band with the transmitter main carrier frequency but coincident with a sub band being used by a collocated receiver) are turned off, preventing transmitter spurious emissions and broadband noise from entering passbands of those receivers.

Various embodiments may include determining the subbands in the CLIC system 610 and/or transmitter system 210 to turn off/disable based on predicting/determining frequency subbands where unintended signals or noise may be generated. One variation may turn off/disable certain receiver system and/or transmitter system subbands, based on particular subbands the transmitter is broadcasting signals in. For example, if the transmitter is transmitting particular modulated signals in particular subbands, subband locations of noise (e.g., intermodulation signals) resulting from the transmitted signals can be predicted/determined, and those subbands in the transmitter system 210 and/or receiver system 610 may be turned off (if not being used to transmit or receive signals). For example, suppose the transmitter system is transmitting a 3 MHz modulated signal and also transmitting a 5 MHz modulated signal. The control unit 220 may predict/determine (e.g., based on the frequency, bandwidth, modulation schemes, and/or environment) that unintended harmonic or intermodulation signals at 8 MHz, 7 MHz, 6 MHz, 10 MHz, and/or 15 MHz may be generated, and based on this prediction/determination, shut off/disable one or more subbands potentially including the predicted noise/intermodulation signals in the transmitter system 210 (e.g., by disabling the HPAs in those subbands) and/or in the receiver system 610 (e.g., by disabling the LPAs in those subbands). The control units 220 may additionally or alternatively disable the subbands including 3 MHz and 5 MHz in the receiver, which are directly being transmitted by the transmitter.

Another variation may include determining the subbands in the receiver system 610 and/or transmitter system 210 to turn off/disable based on predicting/determining frequency subbands where signals transmitted in those subbands may generate harmonics, intermodulation and/or noise in other subbands which are allocated to the receiver system for receiving signals. For example, if the receiver system 610 is receiving (or listening for) particular modulated signals in a particular subband, locations can be predicted/determined of signals in other subbands that could result in unintended signals (e.g., intermodulation or noise) in the subband including the intended received signal, and those other subbands in the transmitter system and/or receiver system may be turned off (if not being used to receive or transmit signals). For example, suppose the receiver system 610 is receiving an intended 8 MHz signal. The control unit 220 may predict/determine that unintended intermodulation signals at 8 MHz could be generated by simultaneously transmitting a 3 MHz signal and a 5 MHz signal from the transmitter system 210 (e.g., due to nonlinearities in the transmitter system) or simultaneously receiving a 3 MHz signal and a 5 MHz signal at the receiver system 610 (e.g., due to nonlinearities in the receiver system). In other variations, the control units 220 may predict/determine that unintended intermodulation signals at 8 MHz in the receiver system 610 could be generated by simultaneously transmitting a 3 MHz signal from a first transmitter system and a 5 MHz signal from a second transmitter system (Note, while one transmitter system and one receiver system are shown, the control could be applied to multiple transmitter systems and/or multiple receiver systems). Based on these determination, the control units 220 may shut off/disable one or more subbands (e.g., either the 3 MHz or the 5 MHz or both) potentially including the noise or intermodulation generating signals in one or more transmitter systems (e.g., by disabling the HPAs in those subbands) and/or in the receiver system (e.g., by disabling the LPAs in those subbands). This computer control of hardware virtually eliminates topside interference.

Various embodiments further include one or more cooling devices 810 that cryogenically cool various components of the transmitter and the receiver systems. These components include any of the pure copper or HTS components discussed herein. The pure copper or HTS components may be separately cooled, or subcomponents including the pure copper or HTS components, such as the BPFs 310, BPFs 330, BPFs 710, BPFs 730, filters 250, filter 650, transmitters 260, receivers 660, amplifiers 320, amplifier 720, splitter 740, and/or any of the linear combiners/splitters may be cryogenically cooled. Entire subsystems such as CLIC 610, CLAC 210, the receive signal splitter circuit 680, and/or the exciter-combiner circuit 280 may be cryogenically cooled with separate cooling devices 810 or with a single cooling device. One example of a cooling device 810 comprises a cryogenic cooler utilizing liquid nitrogen to cool the components/systems, for example, to 77 degrees Kelvin, which is the boiling point of nitrogen. Other embodiments may utilize liquid helium. Various embodiments of cooling device 810 may comprise an open or closed cooling system, and/or may use a single or multi-stage Gifford McMahon machine, pulse tube machine, and/or Sterling cycle machine.

We claim:

1. An apparatus comprising:
an input configured to receive reception signals in a frequency band from a receive antenna;
a bank of input bandpass filters configured to separate the signals into a plurality of frequency subbands;
a bank of amplifiers configured to amplify the signals in each frequency subband of the plurality of frequency subbands separately from the signals in other frequency subbands of the plurality of subbands;
a signal combiner configured to recombine the signals amplified by the bank of amplifiers; and
a computer controller configured to disable one or more individual amplifiers in the bank of amplifiers based on predicted unintended signals in one or more individual frequency subbands of the plurality of frequency subbands.

2. The apparatus of claim 1, further comprising:
one or more cooler devices, wherein the bank of input bandpass filters comprise pure copper inductors, and wherein the one or more cooler devices are configured to cryogenically cool the pure copper inductors.

3. The apparatus of claim 1, wherein each input bandpass filter of the bank of input bandpass filters is impedance matched at a different frequency subband of the plurality of frequency subbands to the receive antenna.

4. The apparatus of claim 1, further comprising:
a bank of output bandpass filters each configured to filter the signals amplified by a respective amplifier of the bank of amplifiers prior to being recombined by the signal combiner.

5. The apparatus of claim 4, further comprising:
one or more cooler devices, wherein the bank of output bandpass filters comprise copper, and wherein the one or more cooler devices are configured to cryogenically cool the copper.

6. A method comprising:
receiving signals in a frequency band and separating the signals into a plurality of frequency subbands with a bank of input bandpass filters from a receive antenna;
amplifying signals in each frequency subband of the plurality of frequency subbands separately from the signals in other frequency subbands of the plurality of frequency subbands using a bank of amplifiers; and
recombining the signals amplified by the bank of amplifiers using a signal combiner;
determining one or more individual amplifiers in the bank of amplifiers to disable based on predicted unintended signals in one or more individual frequency subbands of the plurality of frequency subbands; and
disabling the one or more individual amplifiers in the bank of amplifiers in response to the determining.

7. The method of claim 6, further comprising:
cryogenically cooling pure copper inductors in the bank of input bandpass filters.

8. The method of claim 6, further comprising:
receiving the signals with each input bandpass filter of the bank of input bandpass filters being impedance matched at a different frequency subband of the plurality of frequency subbands to the receive antenna.

9. The method of claim 6, further comprising:
predicting the unintended signals in the one or more individual frequency subbands based on known transmitted signals from a transmitter.

10. The method of claim 6, further comprising:
filtering the signals amplified by each respective amplifier of the bank of amplifiers with a respective output bandpass filter of a bank of output bandpass filters prior to being recombined.

11. The method of claim 10, further comprising:
cryogenically cooling pure copper inductors in the bank of output bandpass filters.

12. A method comprising
receiving signals in a frequency band from a receive antenna and separating the signals into a plurality of frequency subbands with a bank of input bandpass filters that comprise input pure copper inductors;
amplifying the signals in each frequency subband of the plurality of frequency subbands separately from the signals in other frequency subbands of the plurality of frequency subbands using a bank of amplifiers; and
filtering the signals amplified by each respective amplifier of the bank of amplifiers with a respective output bandpass filter of a bank of output bandpass filters that comprise output pure copper inductors;
recombining the signals filtered by the bank of output bandpass filters; and
disabling one or more individual amplifiers in the bank of amplifiers based on predicted unintended signals in one or more individual frequency subbands of the plurality of frequency subbands.

13. The method of claim 12, further comprising:
predicting the unintended signals in the one or more individual frequency subbands of the plurality of frequency subbands based on known transmitted signals from a transmitter.

14. The method of claim 12, further comprising:
cryogenically cooling the input pure copper inductors and output pure copper inductors.

15. The apparatus of claim 1, wherein the computer controller is configured predict the unintended signals in the one or more individual frequency subbands of the plurality of frequency subbands based on known transmitted signals from a transmitter located adjacent to the receive antenna.

16. The method of claim 13, wherein the transmitter is located adjacent to the receive antenna.

17. The apparatus of claim 4, wherein each output bandpass filter of the bank of output bandpass filters is impedance matched at a different frequency subband of the plurality of frequency subbands to a common antenna.

* * * * *